(12) United States Patent
Tokuda et al.

(10) Patent No.: US 8,696,816 B2
(45) Date of Patent: Apr. 15, 2014

(54) SEMICONDUCTOR MANUFACTURING APPARATUS

(75) Inventors: Norifumi Tokuda, Tokyo (JP); Yuuko Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 840 days.

(21) Appl. No.: 11/571,971

(22) PCT Filed: Jan. 11, 2005

(86) PCT No.: PCT/JP2005/000174
§ 371 (c)(1),
(2), (4) Date: Jan. 11, 2007

(87) PCT Pub. No.: WO2006/075356
PCT Pub. Date: Jul. 20, 2006

(65) Prior Publication Data
US 2007/0228628 A1    Oct. 4, 2007

(51) Int. Cl.
*C23C 16/00*    (2006.01)
*B25B 11/00*    (2006.01)

(52) U.S. Cl.
USPC ................. 118/728; 156/345.51; 269/21

(58) Field of Classification Search
USPC ...................................... 156/345.51
See application file for complete search history.

(56) References Cited

U.S. PATENT DOCUMENTS

| | | | |
|---|---|---|---|
| 6,565,706 B2 | 5/2003 | Moriuchi | |
| 2003/0180495 A1* | 9/2003 | Ito et al. | 428/64.4 |
| 2004/0164400 A1 | 8/2004 | Meyer-Berg | |

FOREIGN PATENT DOCUMENTS

| | | |
|---|---|---|
| JP | 55 43553 | 3/1980 |
| JP | 59 135742 | 8/1984 |
| JP | 62 199030 | 9/1987 |
| JP | 1 129438 | 5/1989 |
| JP | 1-129438 | 5/1989 |
| JP | 4 152512 | 5/1992 |
| JP | 2574818 | 10/1996 |
| JP | 10 107131 | 4/1998 |
| JP | 10 112495 | 4/1998 |
| JP | 10-112495 | 4/1998 |
| JP | 10-128634 | 5/1998 |
| JP | 2001-345355 | 12/2001 |
| JP | 2004-265962 | 9/2004 |

OTHER PUBLICATIONS

Machine translation of Nishio, JP 10-107131, Apr. 4, 1998.*
Office Action mailed Jul. 20, 2010 in Japanese Application No. 2006-519024 (w/parital English-language translation).
Office Action issued Apr. 26, 2013 in European Patent Application No. 05 703 413.4.
Supplementary Search Report issued Jul. 22, 2010 in European Patent Application No. 05703413.4.

* cited by examiner

*Primary Examiner* — Karla Moore
*Assistant Examiner* — Nathan K Ford
(74) *Attorney, Agent, or Firm* — Oblon, Spivak, McClelland, Maier & Neustadt, L.L.P.

(57) ABSTRACT

The present invention relates to a semiconductor manufacturing apparatus, and an object of the invention is to prevent breakage and deformation of semiconductor substrates without deteriorating operability in processing.
In order to achieve the object, a semiconductor manufacturing apparatus has a stage (100) on which a semiconductor substrate (30) is placed, and the stage (100) has a first metal portion (10) that is made of metal and that comes in contact with the semiconductor substrate (30) placed thereon, and an electroconductive elastic-body portion (20) that is made of an electroconductive elastic body and that comes in contact with the semiconductor substrate (30) placed thereon. A contaminant (40) is embedded in the electroconductive elastic-body portion (20).

3 Claims, 10 Drawing Sheets

F I G . 1
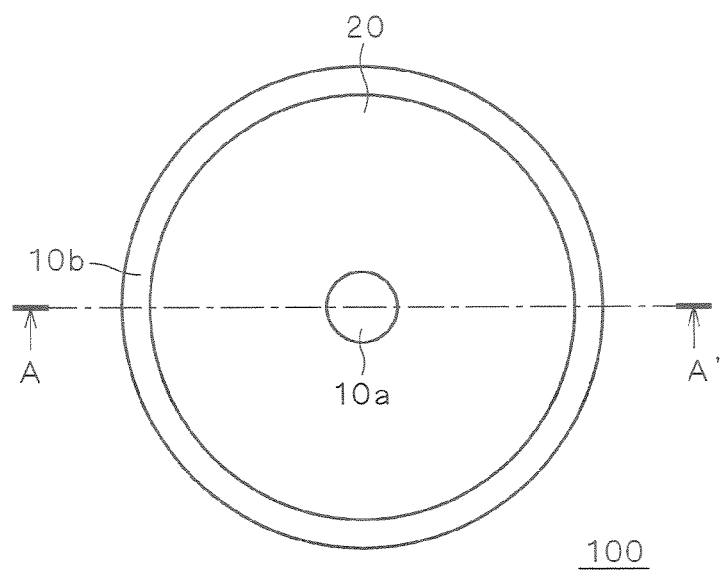
F I G . 2
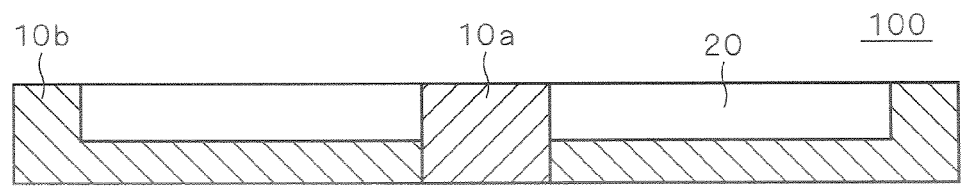

F I G. 5
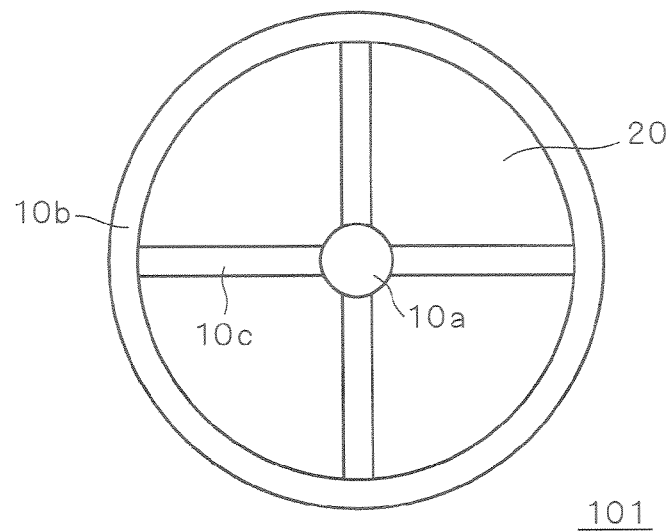
F I G. 6
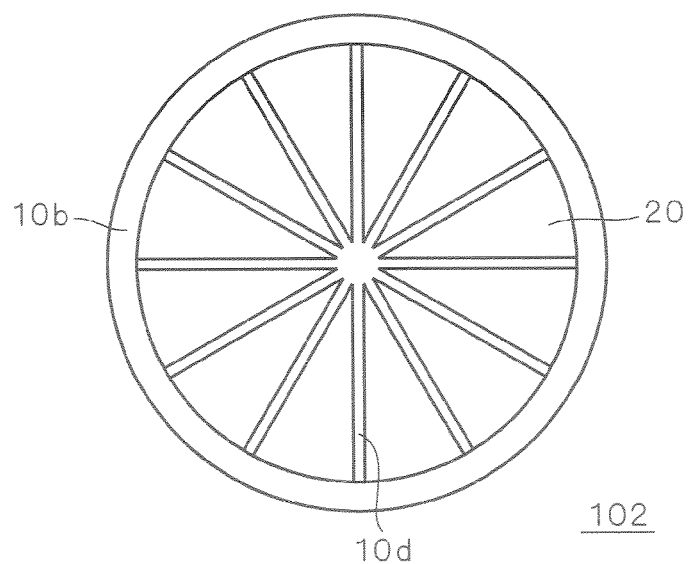

F I G. 2 1
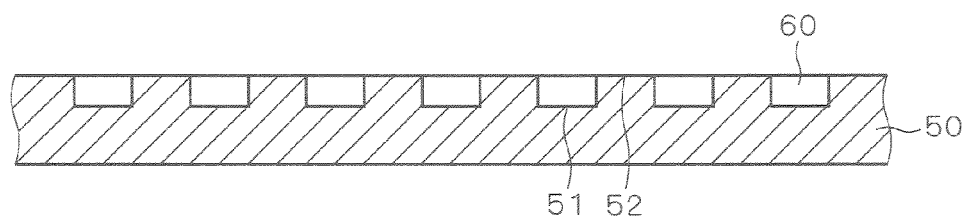
F I G. 2 2
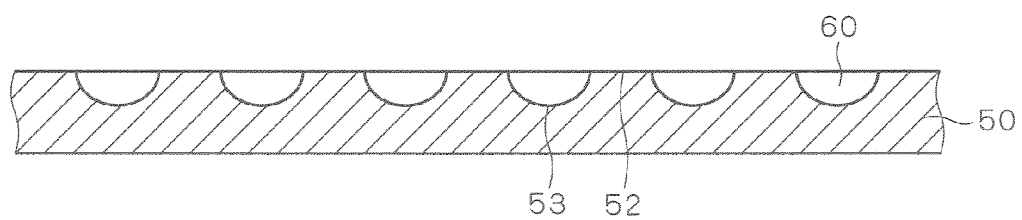
F I G. 2 3
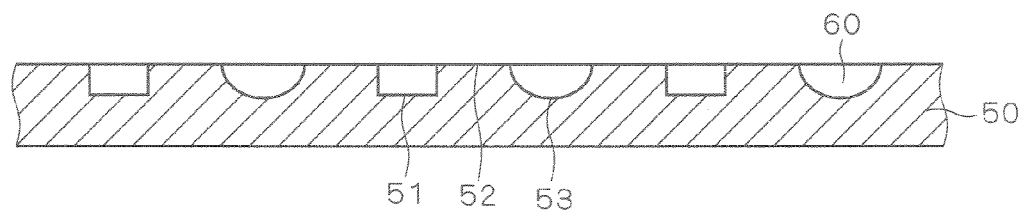

SEMICONDUCTOR MANUFACTURING APPARATUS

TECHNICAL FIELD

The present invention relates to semiconductor manufacturing apparatuses, and particularly to processing of semiconductor substrates.

BACKGROUND ART

With vertical semiconductor devices in which current flows between the first and second main surfaces of the semiconductor substrate (semiconductor wafer), the semiconductor substrates are being made thinner and thinner in order to achieve improvements in characteristics (e.g., to reduce on-state voltage). In a common single-wafer-processing semiconductor manufacturing apparatus, the semiconductor substrates are transported to a metal stage having an approximately flat surface and are set on the stage by suction.

Now, thin semiconductor substrates, having a diameter of 6 inches and a thickness of 200 μm or less, for example, have reduced strength Also, when contaminants such as dust and dust particles of Si attach to the back of a semiconductor substrate and the semiconductor substrate is placed on the stage for processing or for inspection, the contaminants are sandwiched between the semiconductor substrate and the stage. If the contaminants have certain or higher hardness, the semiconductor substrate undergoes considerable stress at and around the contaminants, which may result in breakage or deformation of the semiconductor substrate.

To solve this problem, Patent Document 1 discloses an example of a semiconductor manufacturing apparatus in which a buffer made of an elastic body is interposed between the semiconductor substrate and stage. Also, Patent Documents 2 to 4 disclose examples of semiconductor manufacturing apparatuses in which holes, or the like, are formed in the surface of the stage.

Patent Document 1: Japanese Patent Application Laid-Open No. 55-43853 (1980)
Patent Document 2: Japanese Patent Application Laid-Open No. 62-199030 (1987)
Patent Document 3: Japanese Patent Application Laid-Open No. 59-135742 (1984)
Patent Document 4: Japanese Patent Application Laid-Open No 4-152512 (1992)

In the semiconductor manufacturing apparatus disclosed in Patent Document 1, the presence of the buffer, separate from the stage, is likely to deteriorate operability in processing. Also, in the semiconductor manufacturing apparatuses disclosed in Patent Documents 2 to 4, semiconductor substrates are sucked from the holes, or the like, formed in the surface of the stage Accordingly, when the holes, or the like, are large, the semiconductor substrates undergo considerable stress at and around the holes, which may also result in breakage or deformation of the semiconductor substrates.

DISCLOSURE OF THE INVENTION

The present invention has been made to solve the problems above, and an object of the invention is to provide a semiconductor manufacturing apparatus capable of preventing breakage and deformation of semiconductor substrates without deteriorating operability in processing.

A first aspect of the present invention provides a semiconductor manufacturing apparatus having a stage on which a semiconductor substrate is placed, and the stage comprises a first metal portion that is made of metal and that comes in contact with the semiconductor substrate placed thereon and an electroconductive elastic-body portion that is made of an electroconductive elastic body and that comes in contact with the semiconductor substrate placed thereon.

According to the semiconductor manufacturing apparatus of the first aspect of the invention, when the semiconductor substrate is placed on the stage, the stress applied to the semiconductor substrate when a contaminant adheres on its back is reduced, and the semiconductor substrate is kept flat. This prevents breakage and deformation of the semiconductor substrate without deteriorating operability in processing.

A second aspect of the present invention provides a semiconductor manufacturing apparatus having a stage on which a semiconductor substrate is placed, and the stage comprises a first metal portion that is made of metal not processed to form countless numbers of recesses in its surface and that comes in contact with the semiconductor substrate placed thereon, and a second metal portion that is made of metal processed to form countless numbers of recesses in its surface and that comes in contact with the semiconductor substrate placed thereon.

According to the semiconductor manufacturing apparatus of the second aspect of the invention, when the semiconductor substrate is placed on the stage, the stress applied to the semiconductor substrate when a contaminant adheres on its back is reduced, and the semiconductor substrate is kept flat. This prevents breakage and deformation of the semiconductor substrate without deteriorating operability in processing.

These and other objects, features aspects and advantages of the present invention will become more apparent from the following detailed description of the present invention when taken in conjunction with the accompanying drawings.

BRIEF DESCRIPTION OF THE DRAWINGS

FIG. 1 is a top view of a stage according to a first preferred embodiment of the invention.
FIG. 2 is a cross-sectional view of the stage.
FIG. 5 is a top view of a stage.
FIG. 6 is a top view of a stage.
FIG. 21 is an enlarged cross-sectional view of a part of a stage.
FIG. 22 is an enlarged cross-sectional view of a part of a stage.

FIG. 23 is an enlarged cross-sectional view of a part of a stage.

BEST MODE FOR CARRYING OUT THE INVENTION (First Preferred Embodiment)

FIG. 1 is a top view of a stage 100 of a semiconductor manufacturing apparatus according to a first preferred embodiment of the present invention. FIG. 2 shows the cross section taken along line A-A' of FIG. 1.

As shown in FIGS. 1 and 2, the stage 100 has metal portions (first metal portion) 10a and 10b that are flat and made of metal, and an electroconductive elastic-body portion 20 that is flat and made of e.g., electroconductive silicone rubber. The metal portions 10a and 10b and the electroconductive elastic-body portion 20 come in close contact with a single semiconductor substrate placed on the stage 100. When the stage 100 is of vacuum suction type, a large number of holes for suction are formed in the metal portions 10a and 10b, which are not shown in FIGS. 1 and 2. The holes may be formed also in the electroconductive elastic-body portion 20.

Figure 3:
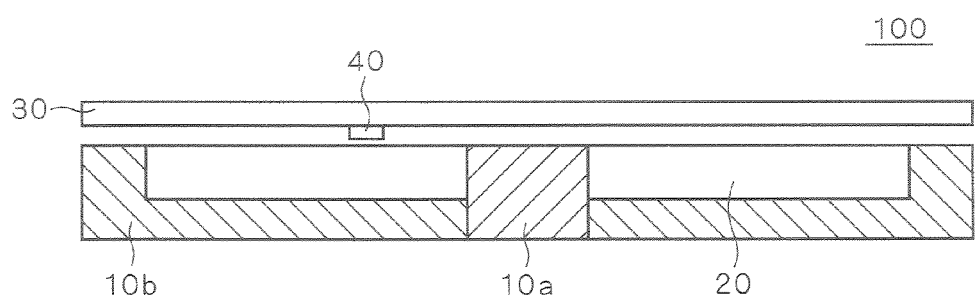
FIG. 3 is a cross-sectional view of the stage.
Figure 4:
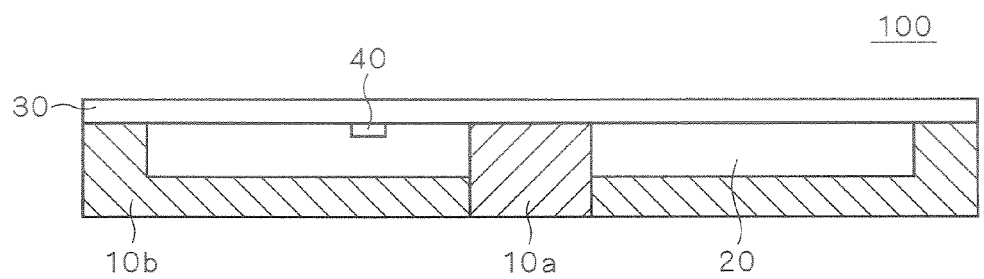
FIG. 4 is a cross-sectional view of the stage.

FIG. 3 is a cross-sectional view showing the stage 100 of FIG. 2 immediately before a semiconductor substrate (semiconductor wafer) 30 having a contaminant 40 adhering on the back, such as dust or Si particle, is placed on the stage 100. FIG. 4 is a cross-sectional view showing the stage 100 on which the semiconductor substrate 30 of FIG. 3 is set by suction. As shown in FIG. 4, the contaminant 40 is embedded in the electroconductive elastic-body portion 20 of the stage 100. Thus, when the semiconductor substrate 30 is set on the stage 100 by suction, the stress applied to the semiconductor substrate 30 due to the contaminant 40 is reduced and the semiconductor substrate 30 is kept flat, whereby the semiconductor substrate 30 is prevented from breaking and deforming.

In the stage 100 of FIG. 1, the ratio between the surface area of the metal portions 10a and 10b and the surface area of the electroconductive elastic-body portion 20 can be arbitrarily determined, but the rate of breakage of the semiconductor substrate 30 can be reduced by increasing the percentage of the surface area of the electroconductive elastic-body portion 20 in the surface area of the stage 100. In particular, it has been found that the rate of breakage of the semiconductor substrate 30 is greatly reduced when the surface area of the electroconductive elastic-body portion 20 makes up 50% or more of the surface area of the stage 100

In the example of FIG. 1, the circular metal portion 10a is formed in the center of the stage 100, the ring-shaped metal portion 10b is formed along the circumference of the stage 100, and the electroconductive elastic-body portion 20 is formed between the metal portion 10a and the metal portion 10b. This arrangement allows the electroconductive elastic-body portion 20 to occupy an increased percentage of the surface area of the stage 100, so as to reduce the rate of breakage of the semiconductor substrate 30, while ensuring conductivity between the stage 100 and the semiconductor substrate 30.

Figure 7:
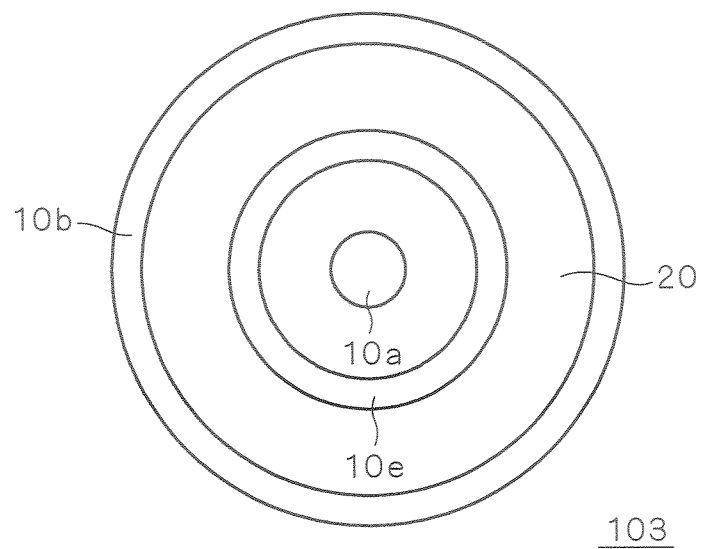
FIG. 7 is a top view of a stage.

When the process requires higher conductivity, or when the semiconductor substrate 30 is warped and conductivity cannot be ensured with the stage 100, for example, the surface area of the metal portion 10 may be increased as shown in FIGS. 5 to 7.

FIG. 5 shows a stage 101 in which in the stage 100 of FIG. 1 metal portions 10c are formed to radially extend in four directions from the center.

FIG. 6 shows a stage 102 in which a metal portion 10d is formed to radially extend in 12 directions from the center, in place of the metal portion 10a of the stage 100 of FIG. 1.

FIG. 7 shows a stage 103 in which a ring-shaped metal portion 10e is formed between the metal portion 10a and the metal portion 10b of the stage 100 shown in FIG. 1.

In the stages 101 to 103 shown in FIGS. 5 to 7, the surface areas of the metal portions 10 occupy higher percentages than in the stage 100 shown in FIG. 1. This offers still higher conductivity than that of the stage 10, and is therefore suitable when the semiconductor substrate 30 is warped and the stage 100 is unable to ensure conductivity, for example.

Figure 8:
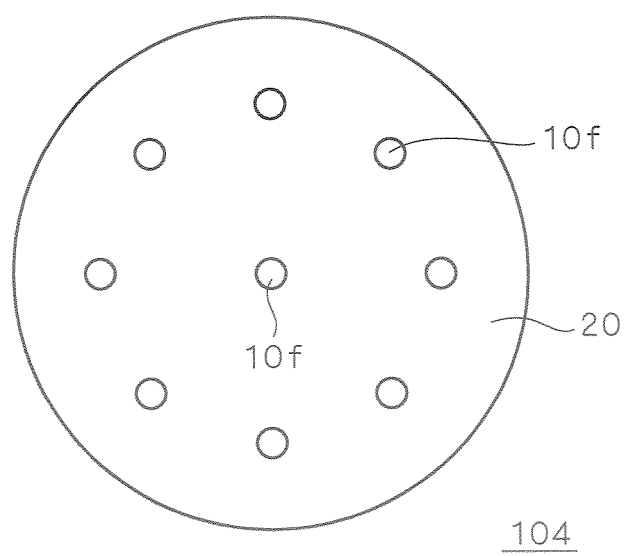
FIG. 8 is a top view of a stage.

FIG. 8 shows a stage 104 in which the central metal portion 10a of the stage 100 of FIG. 1 is replaced by a circular metal portion 10f smaller than the metal portion 10a, and the metal portion 10b is replaced by eight metal portions 10f arranged in the form of a ring.

Figure 9:
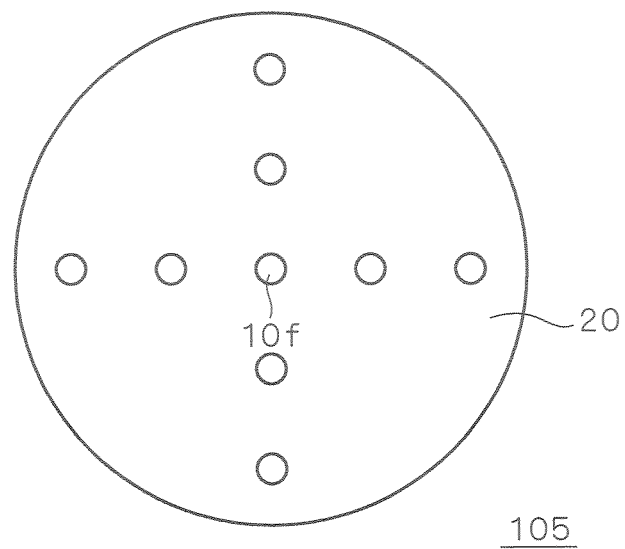
FIG. 9 is a top view of a stage.

FIG. 9 shows a stage 105 in which nine metal portions 10f are arranged in the form of a cross.

In the stages 104 and 105 shown in FIGS. 8 and 9, the surface area of the electroconductive elastic-body portion 20 makes up higher percentages than in the stage 100 shown in FIG. 1. The rate of breakage is thus further reduced as compared with the stage 100.

That is, the forms of the metal portion 10 and the electroconductive elastic-body portion 20 can be arbitrarily determined to adjust the conductivity and the rate of breakage of the semiconductor substrate 30

In this way, in the stages 100 to 105 of this preferred embodiment, when the semiconductor substrate 30 is set by vacuum or electrostatic chuck equipment, for example, the presence of the electroconductive elastic-body portion 20, which is flat and made of, e.g., electroconductive silicone rubber reduces the stress applied to the semiconductor substrate 30 due to the contaminant 40 adhering on the back of the semiconductor substrate 30, and the semiconductor substrate 30 is kept flat. This prevents breakage and deformation of the semiconductor substrate 30 without deteriorating operability in processing or inspections.

While the description above has shown examples in which the electroconductive elastic-body portion 20 is made of electroconductive silicone rubber, the material of the electroconductive elastic-body portion 20 is not limited to electroconductive silicone rubber, but the electroconductive elastic-body portion 20 may be made of any elastic body having conductivity.

(Second Preferred Embodiment)

In the stages 100 to 105 of the first preferred embodiment, the flat, electroconductive elastic-body portion 20 of electroconductive silicone rubber is partially formed so that the contaminant 40 is embedded therein to reduce the stress applied to the semiconductor substrate 30. However, a metal portion made of surface-roughened metal may be formed in place of the electroconductive elastic-body portion 20

Figure 10:
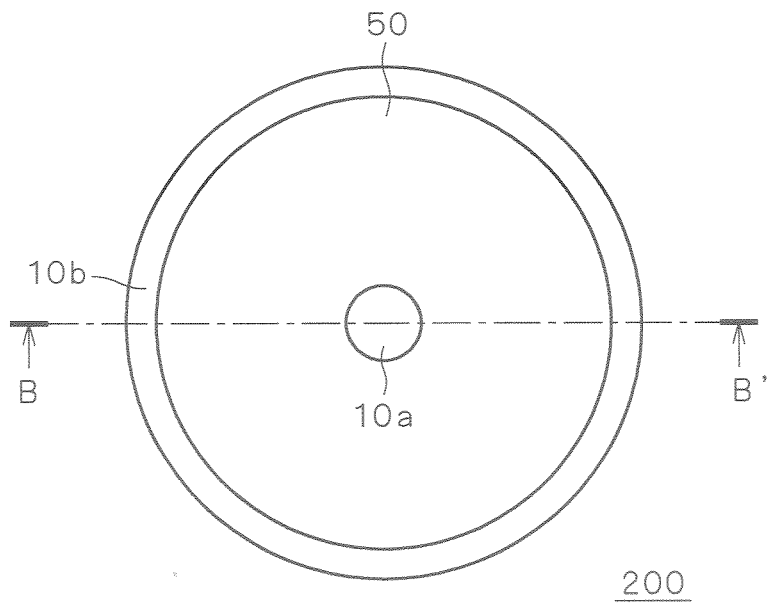
FIG. 10 is a top view of a stage according to a second preferred embodiment of the invention.
Figure 11:
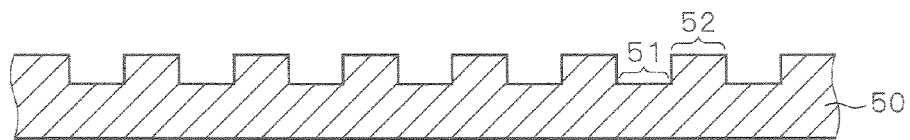
FIG. 11 is a enlarged cross-sectional view of a part of the stage.

FIG. 10 is a top view showing a stage 200 of a semiconductor manufacturing apparatus according to a second preferred embodiment of the present invention. FIG. 11 is an enlarged view showing a part of the cross section taken along line B-B' of FIG. 10.

In FIG. 10, the electroconductive elastic-body portion 20 of FIG. 1 is replaced by a metal portion (a second metal portion) 50 that is made of surface-roughened metal. As shown in FIG. 11, the surface of the metal portion 50 has uncounted numbers of recessed portions (recesses) 51 and raised portions 52. The metal portions 10a and 10b and the raised portions 52 come in close contact with a single semiconductor substrate 30 placed on the stage 200. When the stage 200 is of vacuum suction type, a large number of holes for suction are formed in the metal portions 10a and 10b, which are not shown in FIGS. 10 and 11. By for ing the suction holes not in the recessed portions 51 but only in the metal portions 10a and 10b, it is possible to prevent the problem that the suction causes considerable stress onto the semiconductor substrate 30 at holes formed in the recessed portions 51, thus preventing breakage or deformation of the semiconductor substrate 30.

Figure 12:
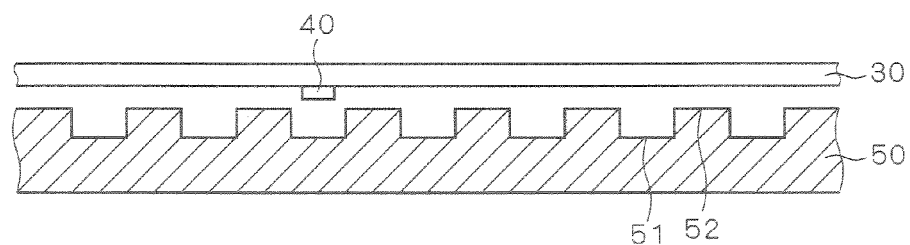
FIG. 12 is an enlarged cross-sectional view of the part of the stage.
Figure 13:
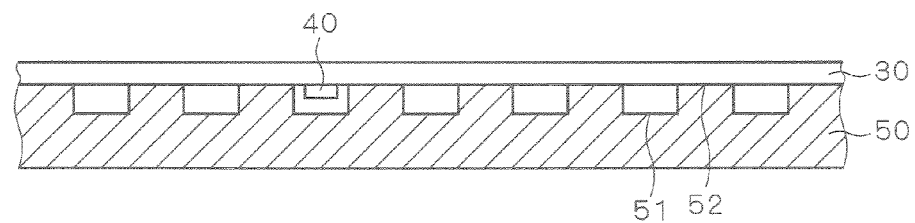
FIG. 13 is an enlarged cross-sectional view of the part of the stage.

FIG. 12 is a cross-sectional view showing the stage 200 of FIG. 11 immediately before a semiconductor substrate 30, having a contaminant 40 on its back, is placed on the stage 200. FIG. 13 is a cross-sectional view showing the stage 200 on which the semiconductor substrate 30 of FIG. 12 is set by suction. In FIG. 12, when the contaminant 40 adheres to the back of the semiconductor substrate 30 above a recessed portion 51, the contaminant 40 comes in the recessed portion 51 of the stage 200 as shown in FIG. 13. Thus, as in the first preferred embodiment, when the semiconductor substrate 30 is set on the stage 200 by suction, the stress applied to the semiconductor substrate 30 due to the contaminant 40 is reduced, and the semiconductor substrate 30 is kept flat, whereby breakage and deformation of the semiconductor substrate 30 are prevented.

In FIG. 12, when the contaminant 40 adheres to the back of the semiconductor substrate 30 not above a recessed portion 51 but above a raised portion 52, the flow of air caused by suction pushes the contaminant 40 toward a recessed portion 51, and the contaminant 40 comes in the recessed portion 51.

In the stage 200 of FIG. 10, the ratio between the surface area of the metal portions 10a and 10b and the surface area of the metal portion 50 can be arbitrarily determined, but, as in the first preferred embodiment, the rate of breakage of the semiconductor substrate 30 can be reduced by increasing the percentage of the surface area of the metal portion 50 in the surface area of the stage 200. In particular it has been found that the rate of breakage of the semiconductor substrate 30 is greatly reduced when the surface area of the metal portion 50 makes up 50% or more of the surface area of the stage 200.

In the example of FIG. 10, the circular metal portion 10a is formed in the center of the stage 200, the ring-shaped metal portion 10b is formed along the circumference of the stage 200, and the metal portion 50 is formed between the metal portion 10a and the metal portion 10b. As in the first preferred embodiment, this arrangement allows the metal portion 50 to occupy an increased percentage of the surface area of the stage 200, so as to reduce the rate of breakage of the semiconductor substrate 30, while ensuring conductivity between the stage 200 and the semiconductor substrate 30.

Figure 14:
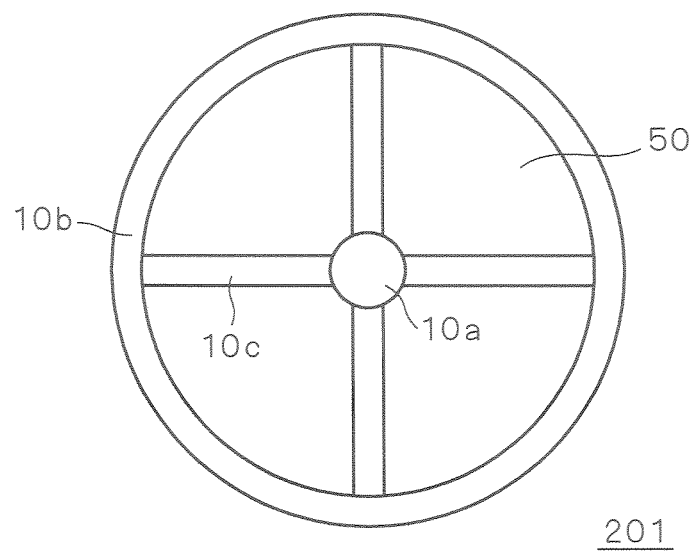
FIG. 14 is a top view of a stage.
Figure 15:
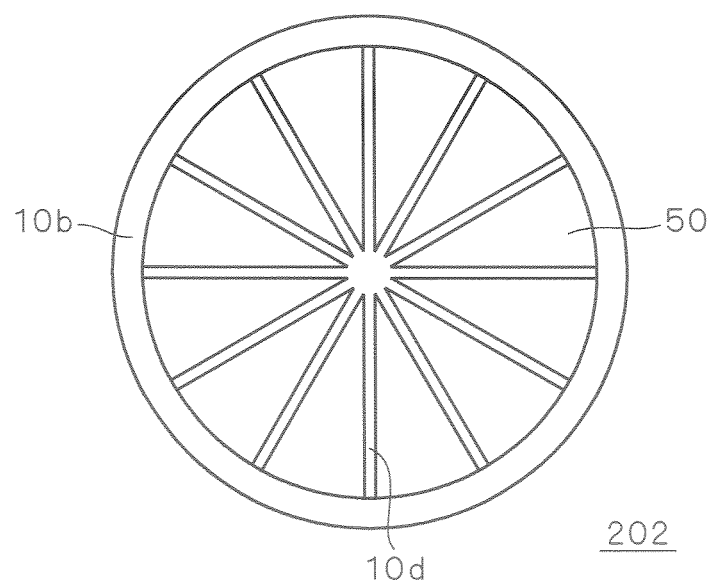
FIG. 15 is a top view of a stage.
Figure 16:
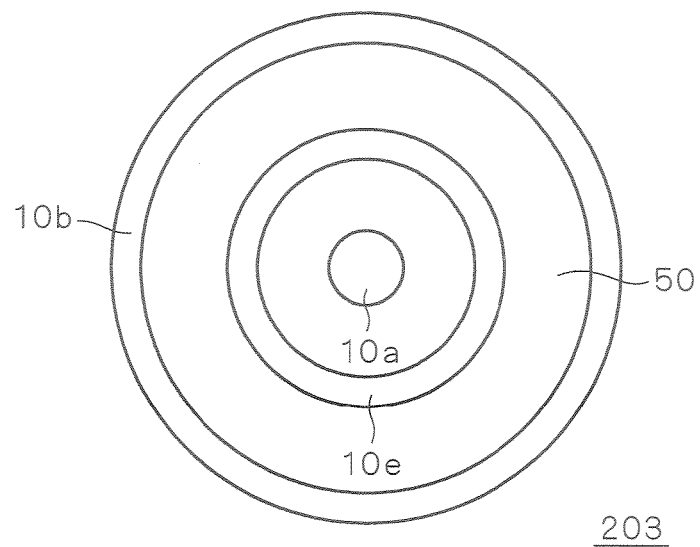
FIG. 16 is a top view of a stage.

Also, as in the first preferred embodiment, when the process requires higher conductivity, or when the semiconductor substrate 30 is warped and conductivity cannot be ensured with the stage 200, for example, the surface area of the metal portion 10 may be increased as shown in FIGS. 14 to 16.

FIGS. 14 to 16 show examples in which, in the structures of FIGS. 5 to 7, the metal portion 50 is formed in place of the electroconductive elastic-body portion 20.

In the stages 201 to 203 shown in FIGS. 14 to 16, the surface areas of the metal portions 10 ma e up higher percentages than in the stage 200 shown in FIG. 10. This offers still higher conductivity than that of the stage 200, and is therefore suitable when the semiconductor substrate 30 is warped and the stage 200 is unable to ensure conductivity, for example.

Figure 17:
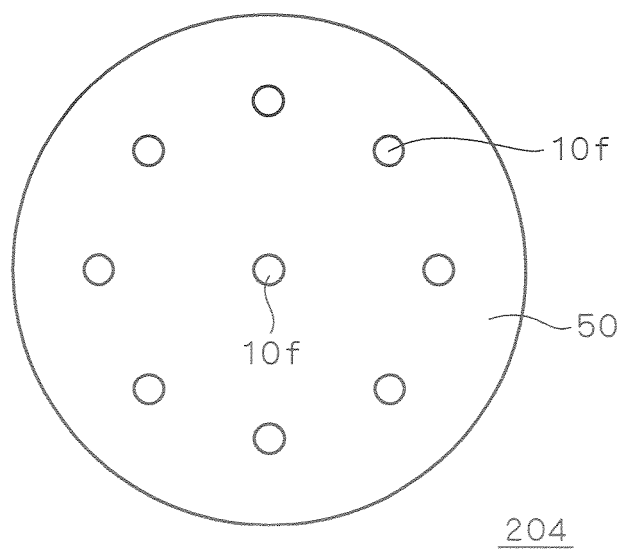
FIG. 17 is a top view of a stage.
Figure 18:
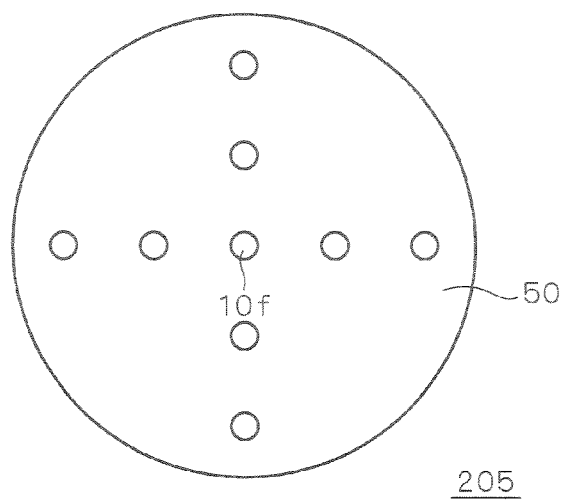
FIG. 18 is a top view of a stage.

FIGS. 17 and 18 show examples in which, in the structures of FIGS. 8 and 9, the metal portion 50 is formed in place of the electroconductive elastic-body portion 20.

In the stages 204 and 205 respectively shown in FIGS. 17 and 18, the surface areas of the metal portions 50 make up higher percentages than in the stage 200 show in FIG. 10. The rate of breakage is thus further reduced than with the stage 200.

That is, the forms of the metal portion 10 and the metal portion 50 can be arbitrarily determined to adjust the conductivity and the rate of breakage of the semiconductor substrate 30.

Figure 19:
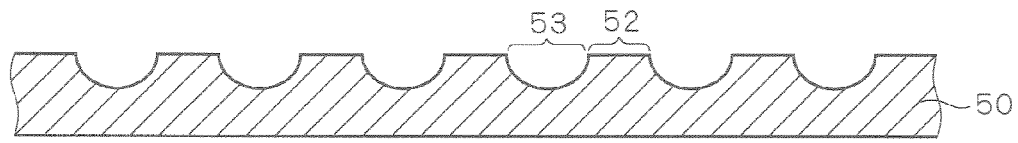
FIG. 19 is an enlarged cross-sectional view of a part of a stage.
Figure 20:
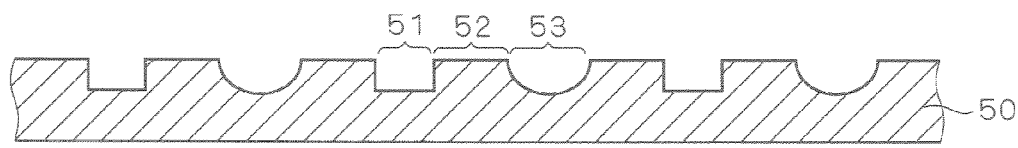
FIG. 20 is an enlarged cross-sectional view of a part of a stage.

FIGS. 11 to 13 have shown an example in which the recessed portions 51 in the metal portion 50 are rectangularly shaped in cross section but recessed portions 53 that are curved in cross section as shown in FIG. 19 may be formed in place of the rectangular recessed portions 51. Alternatively, as shown in FIG. 20, both of recessed portions 51 and 53 may be formed. That is, the depths, areas, shapes, ad positions of the holes and recessed portions 51 and 53 may be determined arbitrarily. It is known that the rate of breakage of the semiconductor substrate 30 is greatly reduced when the recessed portions 51 and 53 have an area of 1 to 10000 $\mu m^2$ and a depth of 1 to 100 $\mu m$.

Also, as shown in FIGS. 21 to 23, the recessed portions 51 and 53 of FIGS. 11, 19 and 20 may be filled with an electroconductive elastic body 60. That is, FIGS. 21 to 23 respectively show examples in which the recessed portions 51 and 53 of FIGS. 11, 19 and 20 are filled with electroconductive elastic body 60. Filling the recessed portions 51 and 53 with the electroconductive elastic body 60 alleviates abnormal discharge when high voltage is applied between the first and second main surfaces of the semiconductor substrate 30 or between the stage 200 and an upper electrode formed on the first main surface of the semiconductor substrate 30.

In this way, in the stages 200 to 205 of this preferred embodiment, the electroconductive elastic-body portions 20 of the stages 100 to 105 of the first preferred embodiment are replaced by the metal portion 50 made of surface-roughened metal. As in the first preferred embodiment, this prevents breakage and deformation of the semiconductor substrate 30 without deteriorating operability in processing or inspections.

While the description above has shown examples in which the metal portion 50 is made of surface-roughened metal, the metal portion 50 may be processed in other ways than surface roughening, as long as the metal portion 50 has countless numbers of recesses formed in its surface.

While the invention has been described in detail, the foregoing description is in all aspects illustrative and not restrictive. It is understood that numerous other modifications and variations can be devised without departing from the scope of the invention.

The invention claimed is:

1. A semiconductor manufacturing apparatus comprising:
a stage on which a semiconductor substrate is placed, wherein said stage includes,
a first metal portion that is made of metal and that comes in contact with said semiconductor substrate placed thereon, and
an electroconductive elastic-body portion that is made of an electroconductive elastic body and that comes in contact with said semiconductor substrate placed thereon, wherein
said first metal portion comprises a discoid metal portion formed in a center of said stage and a ring-shaped metal portion formed along a periphery of said stage, and said discoid metal portion having a flat top surface, the entirety of said flat top surface in contact with and bearing the substrate, and said electroconductive elastic-body portion has a surface area that makes up 50% or more of a surface area of said stage.

2. The semiconductor manufacturing apparatus according to claim 1, wherein said first metal portion further includes a plurality of metal portions that radially extend from the discoid metal portion to the ring-shaped metal portion.

3. The semiconductor manufacturing apparatus according to claim 1, further comprising another ring shaped metal portion between the discoid metal portion and the ring-shaped metal portion.

* * * * *